United States Patent
Schmidt-Boecking et al.

(10) Patent No.: US 6,624,584 B2
(45) Date of Patent: Sep. 23, 2003

(54) PARTICLE SOURCE FOR PRODUCING EXCITED PARTICLES

(75) Inventors: Horst Schmidt-Boecking, Kelkheim (DE); Lutz Spielberger, Frankfurt (DE); Angela Braeuning-Demian, Kriftel (DE); Maria Cristina Penache, Frankfurt (DE); Sven Schoessler, Frankfurt (DE); Till Jahnke, Frankfurt (DE); Oliver Hohn, Gruendau (DE); Volker Mergel, Wiesbaden (DE)

(73) Assignee: Roentdek Handels GmbH, Kelkheim (DE)

( * ) Notice: Subject to any disclaimer, the term of this patent is extended or adjusted under 35 U.S.C. 154(b) by 0 days.

(21) Appl. No.: 09/962,525

(22) Filed: Sep. 24, 2001

(65) Prior Publication Data

US 2002/0084180 A1 Jul. 4, 2002

(51) Int. Cl.$^7$ .................................................. H01J 7/24
(52) U.S. Cl. .............................. 315/111.81; 315/111.41; 315/111.91; 250/423 R; 250/423 F; 250/492.21
(58) Field of Search ........................ 315/111.21, 111.41, 315/111.71, 111.81, 111.91; 250/423 R, 423 F, 427, 492.21

(56) References Cited

U.S. PATENT DOCUMENTS

| | | | | |
|---|---|---|---|---|
| 4,423,355 A | * | 12/1983 | Kageyama | 315/111.81 |
| 4,506,160 A | * | 3/1985 | Sugawara et al. | 250/427 |
| 4,749,910 A | * | 6/1988 | Hara et al. | 315/111.81 |
| 5,821,548 A | * | 10/1998 | Hinchliffe | 250/492.21 |
| 6,130,507 A | * | 10/2000 | Maishev et al. | 315/111.81 |
| 6,137,231 A | * | 10/2000 | Anders et al. | 315/111.21 |
| 6,333,632 B1 | * | 12/2001 | Yang et al. | 324/464 |
| 6,452,194 B2 | * | 9/2002 | Bijkerk et al. | 250/492.2 |

* cited by examiner

Primary Examiner—Haissa Philogene (57) ABSTRACT

The invention relates to a particle source, particularly an ion source for the production of excited particles in gaseous media. A dielectric, e.g., Kapton foil, is coated electrically conductively on both sides, and a voltage, preferably pulsed, is applied between the two coatings. A gas discharge is ignited in the gas through-flow by the voltage. Due to a pressure difference between the two sides of the foil, the gas expands from the high pressure side to the low pressure side, preferably in an ultrasonic expansion, whereby a directed, cold beam of excited particles or ions is produced.

33 Claims, 7 Drawing Sheets

PARTICLE SOURCE FOR PRODUCING EXCITED PARTICLES

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

A particle source in general, and in particular to a particle source is provided for the production of excited particles in gaseous media.

Ion sources play an important part today in many regions of physics and in industrial application (plasma deposition, implantation, ion etching of microstructures, etc.). The requirements on such ion sources are most manifold, e.g., a given kind or charge state of ions, high intensity, high brilliance, pulsed operation, etc. In general the aim is, however, to combine high intensity with good brilliance in ion sources.

TECHNICAL FIELD

In known ion sources, the ions are produced in plasmas, which as a rule are ignited and operated in the sub-millibar pressure region. It is then found that because of this limited gas and plasma density, only ion beams with surface densities of up to about 0.5 Ampere/cm$^2$ can be attained. A detailed description of such known ion sources is to be found, e.g., in B. Wolf, *Handbook of Ion Sources*, CRC Press, Boca Raton (1995) or I. G. Brown, *The Physics and Technology of Ion Sources*, John Wiley & Sons, New York (1989), which are wholly incorporated herein by reference.

The brilliance or emittance of the ion beam is limited by the temperature of the ions in the source. This temperature is typically several thousand degrees Celsius for the known ion sources, which corresponds to an energy uncertainty in all three spatial directions of about 0.1–1 eV (electron volt). In order to produce ion beams with high current, usually large plasma volumes are required. The same holds for particle sources for the production of particles, e.g., atoms or molecules with electrons in bound excited states, as for ion sources.

Thus, for example, beams with atoms in bound excited states are used for lithography. This also is a field of application for the present invention.

SUMMARY OF THE INVENTION

Therefore an object of the invention is to provide a particle source for excited particles, the particle source having a very small volume, a high particle current, a low emittance and/or a high brilliance, in particular a low energy uncertainty.

A further object of the invention is to provide a cost-efficient and compact particle source for excited particles.

A further object is to make available a particle source for large-area excited particle beams.

The object of the invention is achieved in a surprisingly simple manner by a particle source having a partition with at least one opening. The opening connects a first volume on a first side of the partition with a second volume on a second side of the partition. First particles move from the first volume through the opening into the second volume. Energy is transmitted to the first particles and at least some of the first particles transform to excited states.

In the sense of the invention, the concept "excited particle" includes both particles with electrons in excited bound states and also particles with electrons in excited continuum states, i.e., ions. The concept "particle source for the production of excited particles" thus includes in particular an ion source and also a source for particles, e.g., atoms or molecules, in bound excited states. The latter can additionally also be ionized. Furthermore the concept "excited particle" in the sense of the invention also includes chemical radicals, e.g., by means of a dissociation, particularly of molecules. The particles are thus in particular to be carriers of potential energy. The particles are excited in a manner such that potential energy is stored and can be transferred in a reaction, e.g., to other particles. The particles can however also be carriers of kinetic energy.

The particle source according to the invention produces in an advantageous manner a directed and cold beam of, or at least with, excited microscopic particles.

As a development of the invention, the particle source or ion source includes a first and a second gas volume on a first or second side of a partition, wherein a pressure difference exists between the first and second gas volumes, and gas flows out of the first into the second gas volume through at least one opening in the partition and when flowing through is ionized or excited in a gas discharge. In particular, the particles, atoms or molecules of gas are electronically excited or dissociated. Thus, by means of the particle source according to the invention, e.g. helium ions or electronically excited metastable states, in particular of helium atoms, can be produced, or radicals, e.g., oxygen radicals, can be produced by dissociation of $O_2$ molecules.

As a development of the invention, the particle source uses a partition comprising a dielectric or electrically insulating base layer, an electrically conductive first layer on the first side of the base layer, and an electrically conductive second layer on the second side of the base layer.

Such partitions, particularly in the form of a flexible foil, can be produced easily and at low cost. A voltage can be applied between the two electrically conductive layers providing extremely high electric field strengths within the small opening due to the small geometry. The electric field strengths in the region of the opening are at least about $10^4$, $10^5$, $10^6$, $10^7$, or even $10^8$ V/cm. For this purpose, only relatively low voltages are required, of the order of about 1–1,000 volt. Because of the high field strengths, the particle source can be operated at high pressures of up to $10^{-3}$, $10^{-2}$, $10^{-1}$, 10, or $10^2$ bar on the first side of the partition. The pressure on the second side of the partition is preferably $10^{-4}$, $10^{-5}$, $10^{-6}$, $10^{-7}$ or $10^{-8}$ bar.

As a development of the invention, the pressure difference between the first and second side of the partition is at least one, two, three, four, five or six powers of ten. Thereby the gas expands substantially adiabatic isochorically on flowing through the opening. Thereby the whole enthalpy of the gas in converted into directed motion, so that the gas atoms receive an average speed of $v=(5\ kT/m)^{1/2}$, where k is Boltzmann's constant, T is the gas temperature, and m is the particle mass. The gas then cools to temperatures in the milliKelvin region. An ultrasonic gas jet arises. Ultrasonic gas jets are basically known to a skilled person. The ultrasonic gas jet is now ionized by electron impact ionization in the region of the opening, according to the invention, so that an extremely cold and directed particle beam or ion beam arises.

As a development of the invention, the coldest inner portion of the particle beam is stripped out by a diaphragm, an aperture or a skimmer, so that an even lower energy uncertainty is produced. In order to achieve particularly low particle temperatures, the gas in the first volume is preferably cooled to below 100, 70, 30, 20 or 10 Kelvin.

As a development of the invention, the operation employs a mixed gas of a carrier gas and a working gas, where preferably only the atoms or molecules of the working gas are ionized. The carrier gas substantially determines the thermodynamic properties of the gas expansion. For example, helium is particularly well suited as the carrier gas because of its low atomic weight and its high excitation potential and ionization potential; it cools during the expansion of the working gas. Furthermore, in helium, because of its high electronic excitation energy, the electrons arising in the gas discharge and thereafter accelerated by the electric field assume a high kinetic energy in spite of the high gas pressure. The working gas has a substantially lower excitation potential and ionization potential than helium, so that substantially only the working gas is excited and/or ionized. By selection of the mixing ratio of the carrier and working gases, the average kinetic energy of the electrons, and hence the excitation and/or ionization of the working gas, can be adjusted in a targeted manner.

The transverse momentum uncertainty of the gas, and thereby of the particle beam, is further reduced by cooling the carrier gas, so that the particle beam has an extremely good transverse brilliance.

A development of the invention uses so-called microstructure electrode foils. A microstructure electrode (MSE) comprises one, plural, or many micro-openings. In the case of plural or many openings, these are preferably arranged as a regular, two-dimensional matrix. This can be produced cost-efficiently, over large surfaces, with a small distance between the openings and very small openings. In this embodiment, a large-surface plasma is produced by means of a great number of pores. Ion current densities can thereby be produced of at least $10^{-3}$, $10^{-2}$, $10^{-1}$, 10, 100 or 1,000 Ampere/cm$^2$ in a continuous current or in pulsed operation.

The invention is described hereinbelow with the aid of preferred embodiments and with reference to the accompanying drawings.

Ion sources according to the invention are presented by way of example in what follows. It is however evident to the skilled person that particles, particularly atoms or molecules with electrons in bound excited states which arise, e.g., by electron impact excitation or electron capture can also be produced with the ion sources shown.

DETAILED DESCRIPTION OF THE INVENTION

Figure 1A:
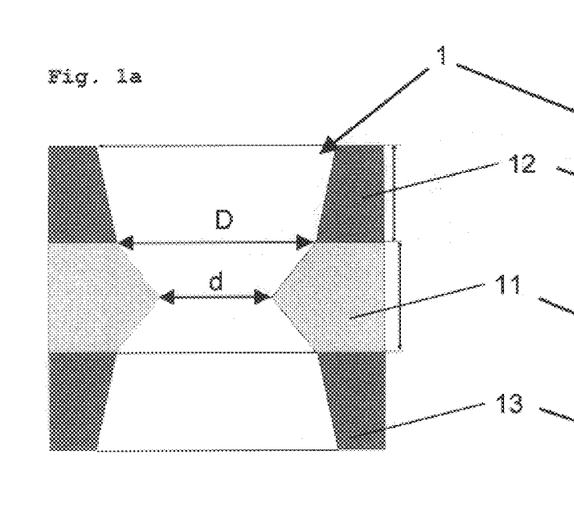
FIG. 1a shows a sectional diagram through a first embodiment of a single pore.

FIG. 1a shows a first preferred embodiment of a single pore 1 with a base layer 11 of Kapton(R) (Polyimide) 50 $\mu$m thick or ceramic about 300 $\mu$m thick, with electrically conductive electrode layers 12, 13 on both sides of the base layer 11. The thickness of the electrode layers 12, 13 is 40–200 $\mu$m of copper or copper-nickel. The electrically conductive layer 12 on the high pressure side 21 is operated as the anode, and the layer 13 on the low pressure side 22 of the pore 1 as the cathode 13. The hole diameter d at the narrowest place, which in this pore is situated in the middle of the insulation layer, is between about 10 and 100 $\mu$m. The diameter D at the boundary between the electrode layer and base layer is 70 $\mu$m up to 150 $\mu$m. The hole spacing when many such pores are used is about 10 $\mu$m up to about 1 mm.

Figure 1B:
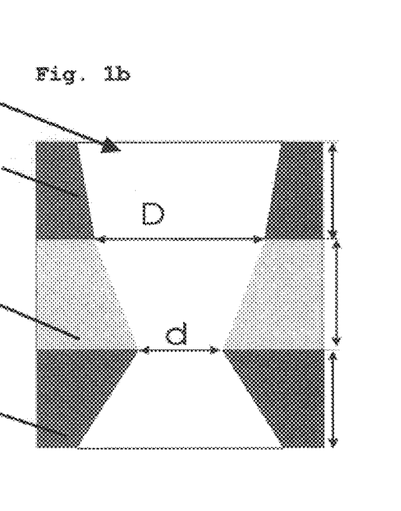
FIG. 1b shows a sectional diagram through a second embodiment of a single pore.

FIG. 1b shows a second embodiment of a pore 1, which differs from the first embodiment of the pore in FIG. 1a in that the smallest diameter d is situated at the boundary between the base layer 11 and the cathode layer 13.

Each individual micro ion source is formed by a micropore 1 in a thin foil. This has a volume of only less than about $10^{-5}$ cm$^3$ and can be operated at pressures on the high pressure side of a few millibar up to a few bar. The electrical voltages required for the production of the ions in a gas discharge 14 are here substantially below 1,000 V and are preferably 200–450 V. Because of the special geometry of the micro ion source system, e.g. with a pore 1 about 100 $\mu$m in diameter and about 250 $\mu$m in length, with very sharp electrode edges, such high field strengths are attained that the discharge ignites immediately and automatically on applying the voltage. Very short delay times of about <1 $\mu$sec are thereby attained. The measured power density per microdischarge (per pore 1) can be from milliWatt up to several hundred Watt in continuous current operation. Power densities of more than 1, 10, or 100 kW/cm$^2$ can thereby be attained. Even higher powers are possible in pulse operation.

Figure 2:
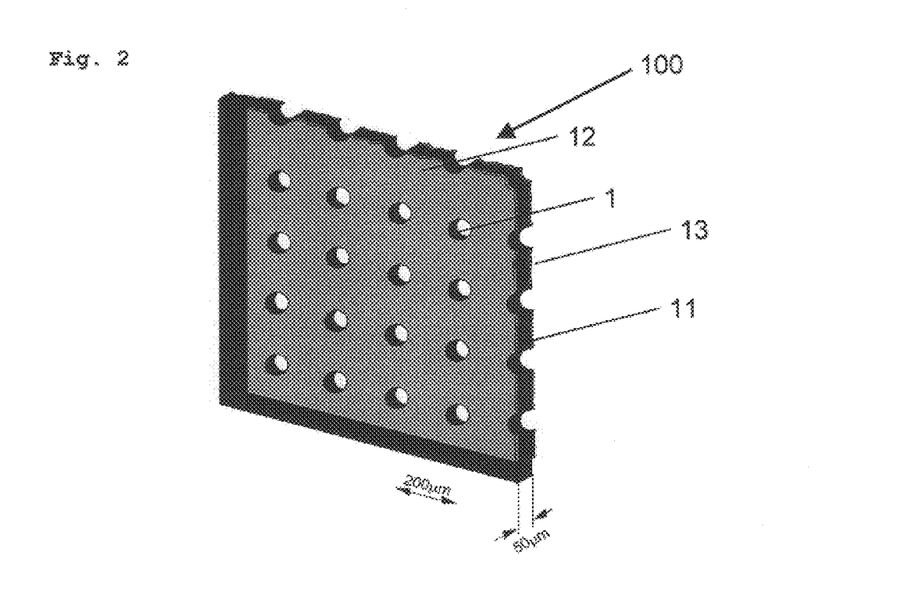
FIG. 2 shows a perspective view of a cut-out portion of an MSE foil.

FIG. 2 shows a portion cut from a MSE foil 100, with 16 pores 1.

Figure 3:
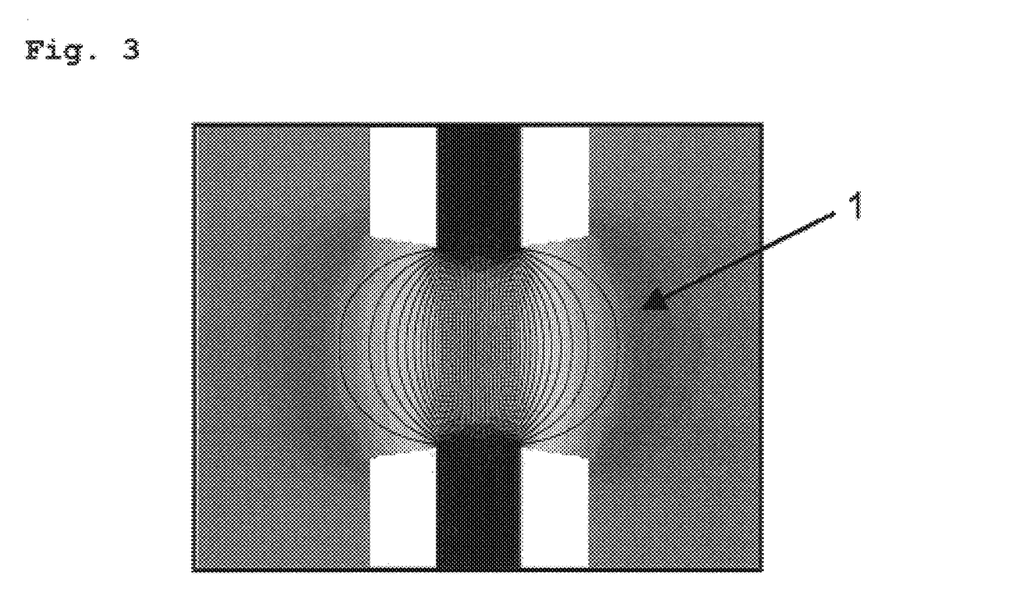
FIG. 3 shows a sectional diagram of the potential distribution in a pore, according to a computer simulation.

FIG. 3 shows, by way of example, the simulated potential distribution in a pore 1 of a MSE foil.

Figure 4:
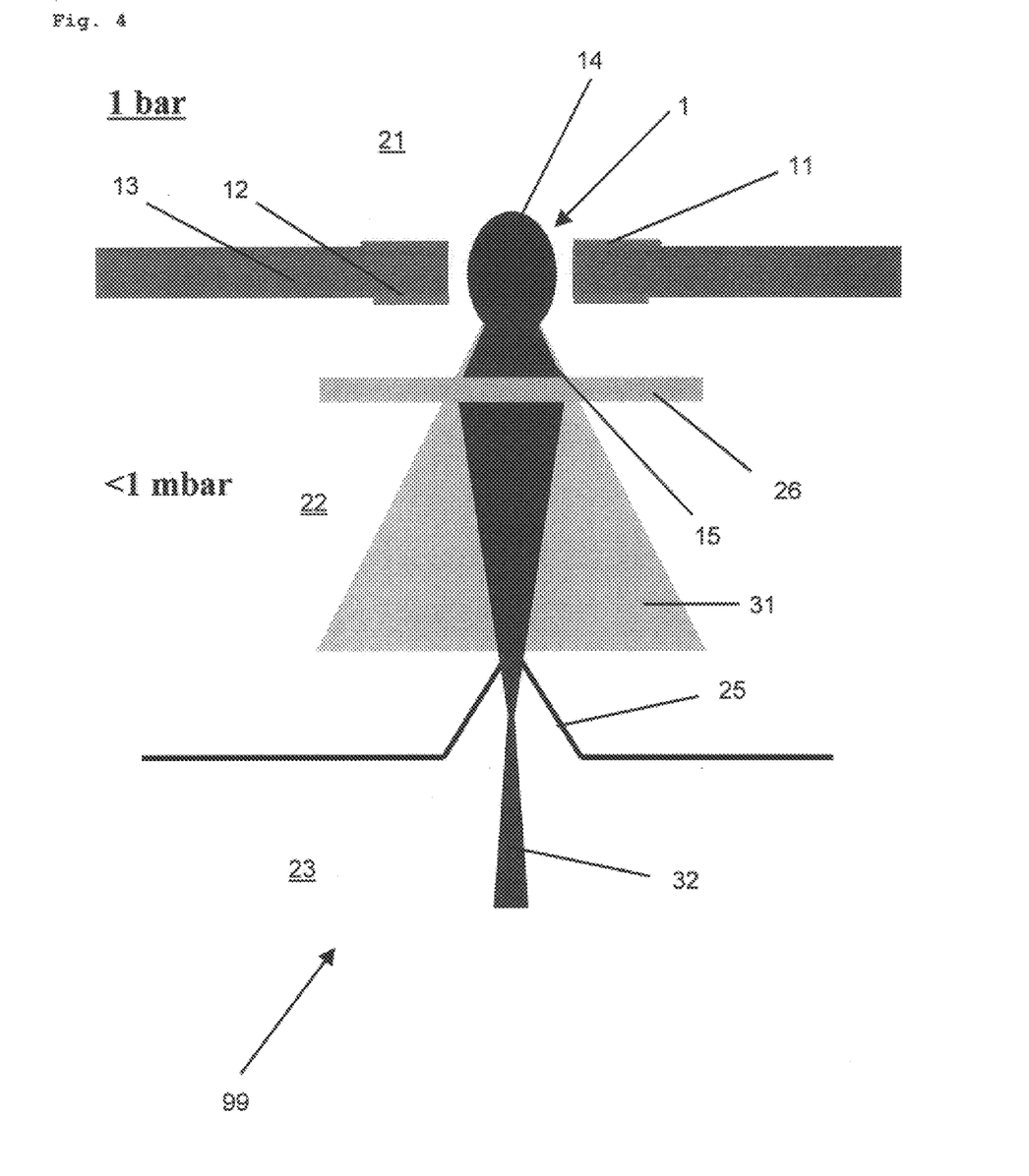
FIG. 4 shows a schematic sectional diagram of a first embodiment of the ion source according to the invention.

FIG. 4 shows an ultrasonic gas jet with the micro gas discharge according to the invention. An ion source 99 with high intensity and excellent emittance is thereby provided. Gas flows from the high pressure side 21 through a pore 1 to the low pressure side 22, with adiabatic isochoric expansion. The then arising ultrasonic gas jet 15 passes in part through the skimmer 25 into the volume 23.

As shown in FIG. 4, the pressure on the anode side, i.e., the high pressure side 21 (vacuum stage 21) of the pore 1 in this embodiment of the invention is about 1 bar; flowing through the pore 1, a very cold ultrasonic beam or jet 15 is formed, with an internal gas temperature of less than 1° K. On the cathode side, i.e., the low pressure side, pressures between $10^{-3}$ up to a few $10^{-1}$ mbar occur in the volume 22, depending on the pump performance. The electrical discharge 14 takes place in the pore 1 and produces ions in a gas discharge 14 by electron impact ionization. The gas to be ionized, i.e., the working gas, is in this embodiment, e.g., $O_2$ or Kr, and is mixed with the carrier gas, here about ninety volume percent helium. However, basically any carrier gas and any working gas can be used. The gas mixture is precooled to about 20° K in the high pressure stage 21. The ionization energies of the exemplary working gases $O_2$ and Kr are substantially lower than that of helium, and hence substantially only the working gas is ionized. In the collisions in the pore 1 during the formation of the ultrasonic jet 15, the ions are cooled by the He, and because of the great difference in ionization potentials, hardly any charge exchange with the helium atoms takes place. Transversely, the ions are cooled down substantially to the internal temperature of the ultrasonic jet 15 and thus attain transverse temperatures of less than 1° K. Longitudinally, the ion beam temperature chiefly depends on the point where the ions arise in the pore, since they are at a slightly different potential depending on the point where they arise. By making the pore 1 longer, or by constructing a multi-electrode pore 80 (FIG. 5), a further improvement in cooling with the carrier gas and in electrical focusing of the ions can be attained in the longitudinal direction also. The longitudinal emittance is thereby also reduced. According to the pressure in the stage 22, the distance between the outlet of the pore 1 on the cathode side 22 and the ion beam stripper 25 or skimmer is optimally set, so that the ultrasonic beam 15 is not destroyed. The distance is about a few mm up to about 1.5 cm. The ultrasonic beam 15 exits the pore 1 directed but not appreciably focused. According to the size of the skimmer 25, about 1 mm diameter or smaller in this embodiment, only a miniscule fraction of the carrier gas 31 will pass through the pore, whereas a larger fraction of the ions passes through the skimmer 25 because of their excellent transverse emittance and focusing. With the aid of a focusing lens 26 between the pore 1 and the skimmer 25, a particularly large fraction of the ion current 32 is conducted through the skimmer.

The ion source 99 is enclosed by a vacuum chamber (not shown), which is evacuated by plural pumps (not shown). Preferably the gas volume 21 is cooled by means of a cryostat (not shown).

Figure 5:
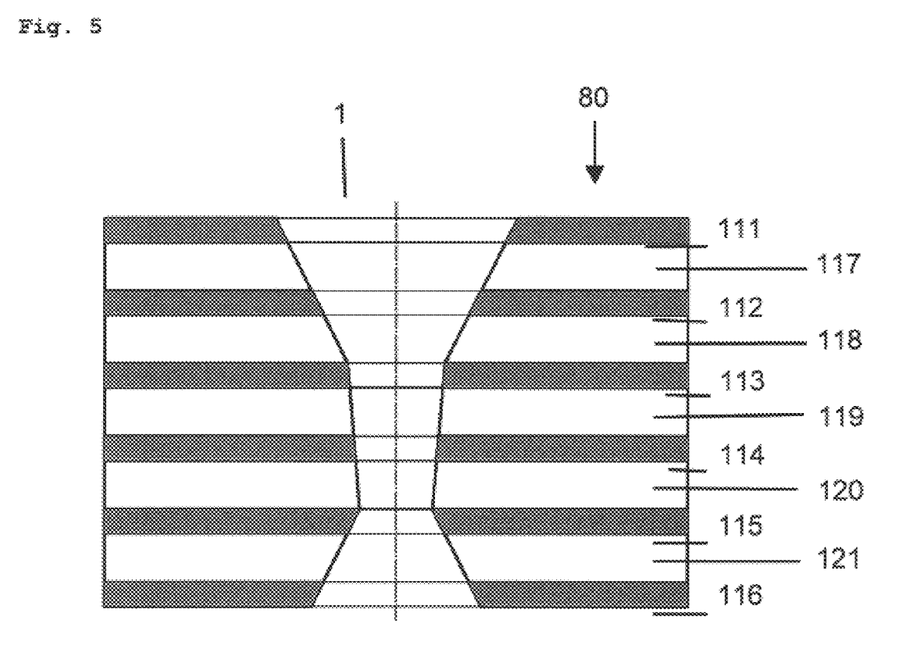
FIG. 5 shows a schematic sectional diagram of an embodiment of the multi-electrode pore according to the invention.

FIG. 5 shows a further embodiment of a pore 1 according to the invention, namely a multi-electrode pore 80. The electrical field is shaped in manifold ways within the pore 80 by means of plural electrodes, six 111, 112, 113, 114, 115, 116 in this embodiment, separated by base layers or insulator layers 117, 118, 119, 120, 121 and arranged one behind the other and control-label independently of each other. Each individual stage, comprising an insulator layer and the two adjacent conductive layers or electrodes, represents a micropore as described hereinabove.

The diameter is narrowed in the flow direction from the electrode 111 as far as the electrode 113, is narrowed with a smaller slope from the electrode 113 as far as the electrode 115, and is widened from the electrode 115 as far as the electrode 116, the diameter at the electrode 116 being smaller than that at the electrode 111. Due to this preferred geometry of the opening, the pressure falls by about an order of magnitude within the region between the electrodes 111 and 113. The ultrasonic jet proper is formed between the electrodes 113 and 116. The ions are cooled here by elastic collisions. The ion beam is optimally transported by the application of suitable voltage to the electrodes. The cooling behavior in the expansion is affected in a predetermined manner by the inner geometry of the pore 80.

Figure 6:
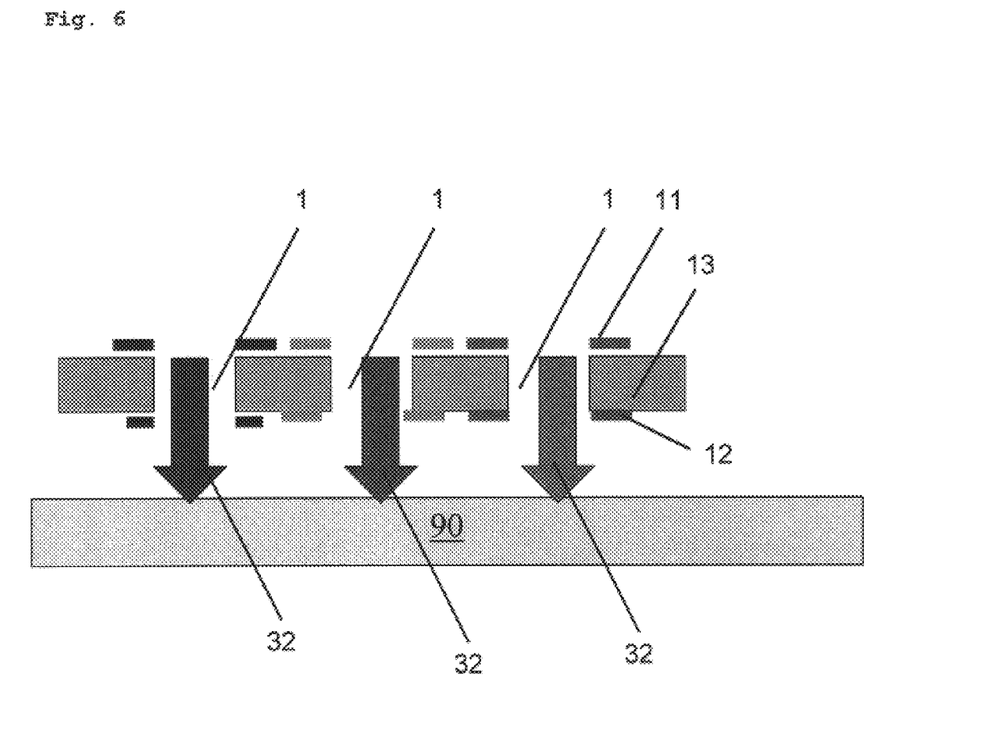
FIG. 6 shows a schematic sectional diagram through a second embodiment of the invention.

FIG. 6 shows a multi-pore ion source 100. Here each pore 1 can be individually controlled. In each pore, independently of each other, a discharge can be switched on and off again in the sub-microsecond region. Such a multipore ion source is particularly suitable for surface cleaning and surface coating of a substrate 90 with an ion current of more than $10^{15}$ ions/sec per pore which can be produced. Because of the very good emittance of the ion beam, a macroscopic mask can for example be reduced to the nanometer range on the substrate 90, and ion beam serigraphy or lithography is possible in the atomic region.

Systematic investigations with single pores 1 have shown that, per pore 1, a discharge of about 3–5 Watt can be operated for hours at 200 V discharge voltage and 15–25 mA current. These values were attained with foils using Kapton (R) as the base layer 13. Ceramic-based foils should give even longer life.

These discharges can be switched on and off extremely rapidly in pulse operation. Switching times of below 10 or 1 $\mu$sec are attained. On-off switching times are longer in known ion sources by more than a factor 100, according to the plasma geometry.

Figure 7:
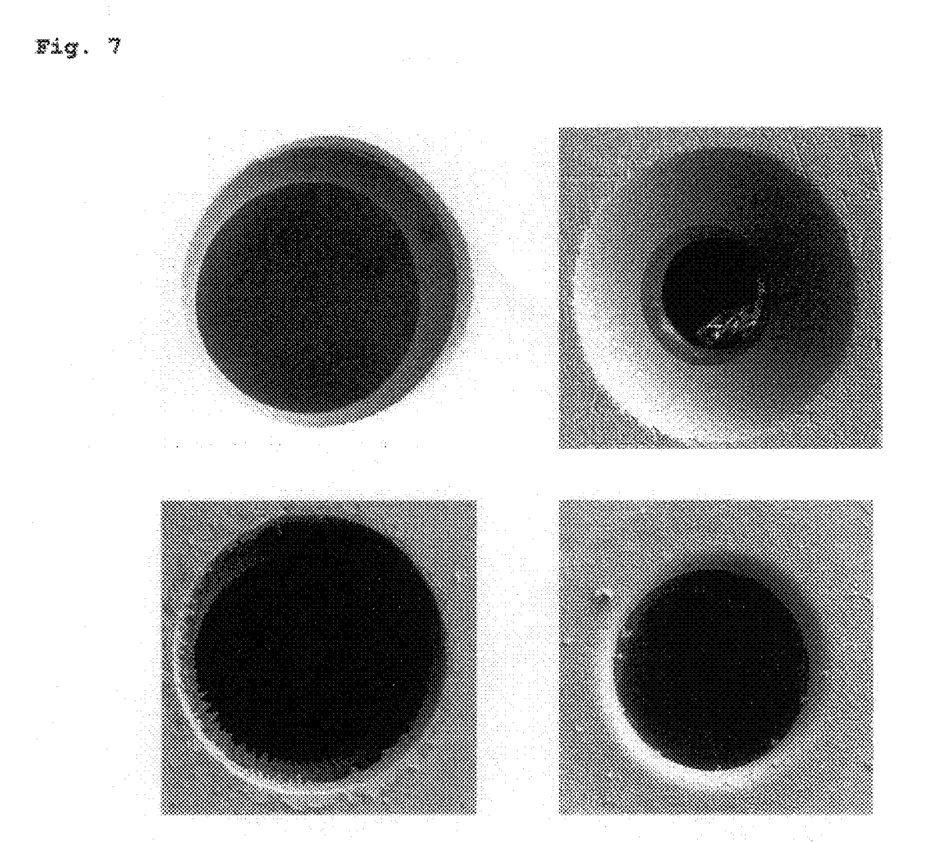
FIG. 7 shows a plan view of two different pore forms, before (upper row) and after operation (lower row).
Figure 8:
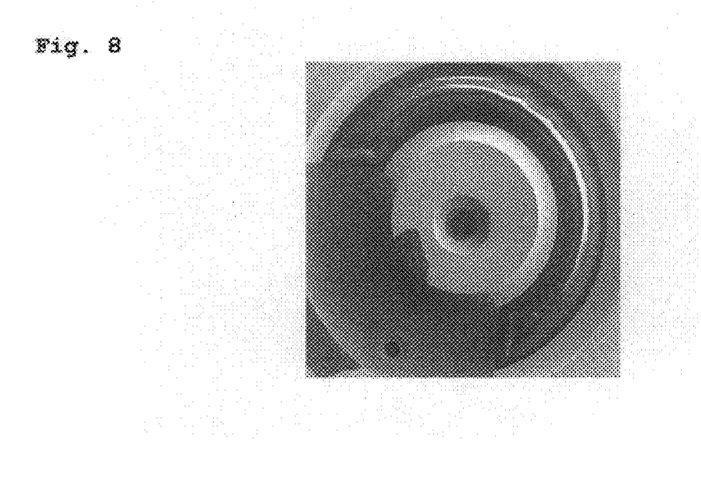
FIG. 8 shows a plan view of a pore with integrated passive resistance.
Figure 9:
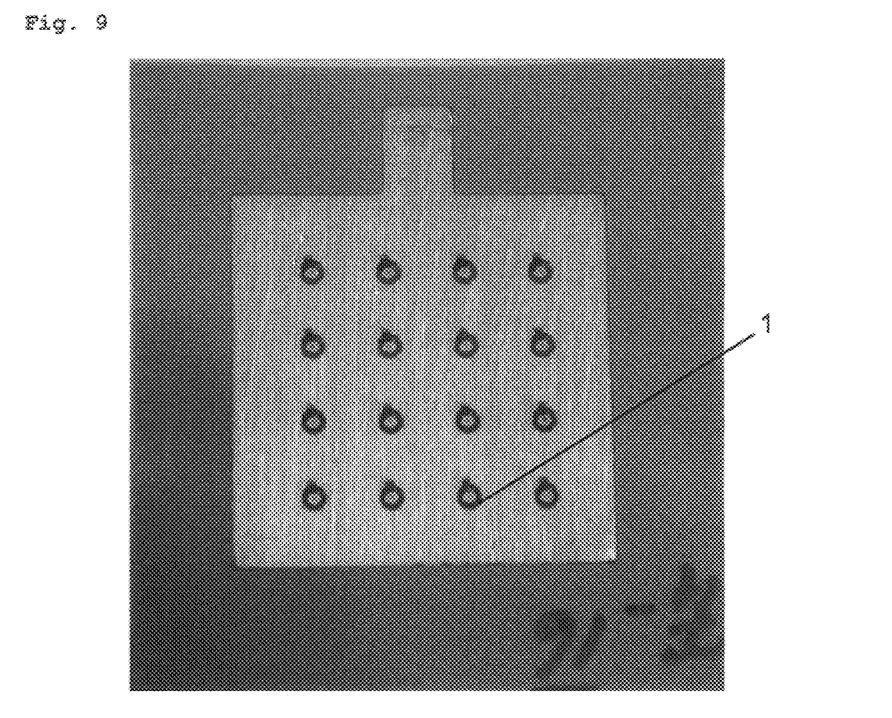
FIG. 9 shows a plan view of a MSE foil with 16 pores.
Figure 10:
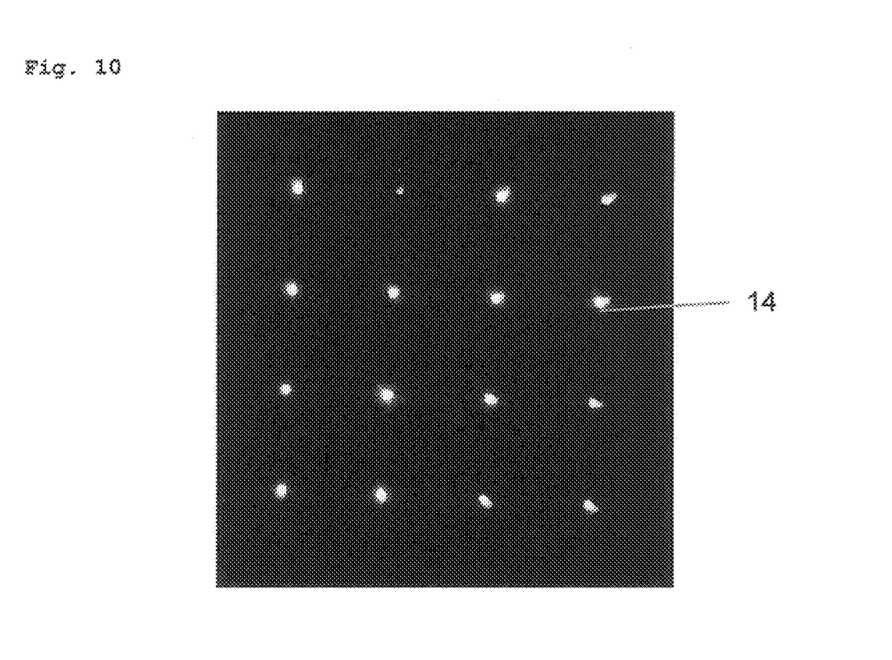
FIG. 10 shows a plan view of the MSE foil of FIG. 9 with glowing micro glow discharges.

FIG. 7 shows a plan view of two different MSE pore shapes, before (upper row) and after (lower row) operation for a few hours.

The individually controllable micro-discharges 14 can be closely integrat-ed with one another in two dimensions, so that more than $10^3$ pores/cm$^2$ are attained. In principle, the size of the surface is nearly unlimited. The limitation is substantially determined solely by the performance of the pumps in the vacuum stage 22 in order to pump out the recyclable He carrier gas, and also by the thermal loading per unit surface, which can lead to destruction of the pore foil 100 by the thermal loading.

The volume of a micro ion source with about 1,000 pores measures only about a surface of about 4×4 mm$^2$, and has a thickness of about 0.3 mm. The geometric volume of the cooled high pressure stage 21 is matched to the desired temperature; it preferably lies in the range of a few cm$^3$. Ion currents of a few hundred mA up to 1 A can be attained with the ion source 99 at transverse temperatures of about 1° K or less. Furthermore, the applied voltage is only a few hundred V, 200–450 V in this embodiment.

An ion source 99 is thus presented which offers very high power densities at high brilliance and very fast control times, based on microstructure electrodes with ultrasonic expansion and ultrasonic ion cooling, and furthermore, because of its size, is to be considered as a microsystem. A decisive physical difference from conventional ion sources results from the extremely high field strength based on the microstructure geometry, so that discharges (glow discharges) can be ignited at a high pressure of about 1 bar and with relatively low voltages.

We claim:

1. A particle source for producing excited particles, comprising a partition with at least one opening, wherein
   said opening connects a first volume on a first side of said partition with a second volume on a second side of said partition,
   first particles move from said first volume through said opening into said second volume,
   energy is transmitted to said first particles and at least some of said first particles are excited to excited states,
   wherein said partition comprises:
      a dielectric base layer,
      a first electrically conductive layer on a first side of said dielectric base layer, and a second electrically conductive layer on a second side of said dielectric base layer.

2. The particle source according to claim 1, wherein said first particles in excited states comprise ions or particles in bound excited states.

3. The particle source according to claim 1, wherein said first volume comprises a first gas volume and said second volume comprises a second gas volume, wherein a pressure difference exists between said first gas volume and said second gas volume, gas flows out of said first gas volume into said second gas volume through said opening, and while flowing through said opening said gas is excited or ionized in a gas discharge within said opening.

4. An apparatus, comprising:
at least one particle source according to claim 1,
a vacuum chamber,
at least one vacuum pump, and
a cooling device for said first volume.

5. The particle source according to claim 1, wherein an electrical voltage is applied between said first electrically conductive layer and said second electrically conductive layer, by which voltage a gas discharge is produced by electron impact ionization in a region of said opening.

6. The particle source according to claim 1, wherein a pulsed electrical voltage is applied between said first electrically conductive layer and said second electrically conductive layer.

7. The particle source according to claim 1, wherein an electrical field strength of at least one of about $10^4$, $10^5$, $10^6$, $10^7$ or $10^8$ V/cm is produced in a region of said opening.

8. The particle source according to claim 3, wherein said gas expands substantially adiabatically through said opening.

9. The particle source according to claim 3, wherein said gas expands substantially ultrasonically through said opening.

10. The particle source according to claim 3, wherein said gas comprises a mixed gas.

11. The particle source according to claim 3, wherein said gas substantially comprises a carrier gas and a working gas.

12. The particle source according to claim 11, wherein due to at least one of different ionization potentials of said carrier gas and said working gas, a mixing ratio of said carrier gas and said working gas, or the geometry of said opening, substantially said working gas is excited or ionized.

13. The particle source according to claim 11, wherein a speed of expansion is substantially determined by said carrier gas.

14. The particle source according to claim 3, wherein gas on said first side of said partition is cooled to below at least one of about 100, 70, 30, 20, or 10 degrees Kelvin.

15. The particle source according to claim 1, wherein a pressure difference between said first volume and said second volume is at least about one, two, three, four, five or six powers of ten.

16. The particle source according to claim 1, wherein at least one of said pressure on said first side of said partition is at least one of $10^{-2}$, $10^{-1}$, 10, or $10^2$ bar, and said pressure on said second side of said partition is at least one of at most $10^{-4}$, $10^{-5}$, $10^{-6}$, $10^{-7}$ or $10^{-8}$ bar.

17. The particle source according to claim 3, wherein said gas is substantially directed to flow out of said opening.

18. The particle source according to claim 1, wherein an arising ion beam is separated by electrical or magnetic fields on said second side of said partition from non-ionized or excited particles.

19. The particle source according to claim 1, wherein a stripper is arranged on said second side of said partition at a predetermined distance from said opening.

20. The particle source according to claim 1, wherein an arising ion beam is focused by electrical or magnetic fields.

21. The particle source according to claim 1, wherein a plurality of openings are provided in said partition.

22. The particle source according to claim 21, wherein different voltages are applied to said openings.

23. The particle source according to claim 21, wherein different average ion charge states are produced by different voltages at said openings.

24. The particle source according to claim 1, comprising:
a first dielectric base layer with an opening,
a first electrode on a first side of said first dielectric base layer, and
a second electrode on a second side of said first dielectric base layer.

25. The particle source according to claim 24, comprising:
a second dielectric base layer, and
a third electrode on a first side of said second dielectric base layer.

26. The particle source according to claim 25, wherein said second electrode is arranged between said first base layer and said second base layer.

27. The particle source according to claim 25, wherein said first electrode,
said first dielectric base layer,
said second electrode,
said second dielectric base layer, and
said third electrode are successively in contact in sandwich form.

28. The particle source according to claim 25, wherein said opening is a through-opening through said first electrode, said second electrode, said third electrode, said first dielectric base layer and said second dielectric base layer.

29. The particle source according to claim 25, wherein said opening has different diameters at at least one of said first electrode, said second electrode, and said third electrode.

30. A particle source for producing excited particles, comprising a partition with at least one opening, wherein
said opening connects a first volume on a first side of said partition with a second volume on a second side of said partition,
first particles move from said first volume through said opening into said second volume,
energy is transmitted to said first particles and at least some of said first particles are excited to excited states,
wherein an arising ion beam is focused by electrical or magnetic fields.

31. A particle source for producing excited particles, comprising a partition with at least one opening, wherein
said opening connects a first volume on a first side of said partition with a second volume on a second side of said partition,
first particles move from said first volume through said opening into said second volume,
energy is transmitted to said first particles and at least some of said first particles are excited to excited states,
wherein said first volume comprises a first gas volume and said second volume comprises a second gas volume, wherein a pressure difference exists between said first gas volume and said second gas volume, gas flows out of said first gas volume into said second gas volume through said opening, and while flowing through said opening said gas is excited or ionized in a gas discharge within said opening, wherein gas on said first side of said partition is cooled to below at least one of about 100, 70, 30, 20, or 10 degrees Kelvin.

32. A particle source for producing excited particles, comprising a partition with at least one opening, wherein said opening connects a first volume on a first side of said partition with a second volume on a second side of said partition, first particles move from said first volume through said opening into said second volume, energy is transmitted to said first particles and at least some of said first particles are excited to excited states, wherein at least one of said pressure on said first side of said partition is at least one of $10^{-2}$, $10^{-1}$, 10, or $10^2$ bar, and said pressure on said second side of said partition is at least one of at most $10^{-4}$, $10^{-5}$, $10^{-6}$, $10^{-7}$ or $10^{-8}$ bar.

33. A particle source for producing excited particles, comprising a partition with at least one opening, wherein said opening connects a first volume on a first side of said partition with a second volume on a second side of said partition, first particles move from said first volume through said opening into said second volume, energy is transmitted to said first particles and at least some of said first particles are excited to excited states, wherein an arising ion beam is separated by electrical or magnetic fields on said second side of said partition from non-ionized or excited particles.

* * * * *